United States Patent
Huang et al.

(10) Patent No.: US 8,258,865 B2
(45) Date of Patent: Sep. 4, 2012

(54) SIGNAL GENERATING APPARATUS AND METHOD THEREOF

(75) Inventors: Chen-Chih Huang, Hsinchu County (TW); Yu-Chang Chen, Taipei (TW); Wei-Chou Wang, Bade (TW); Sheng-Huang Tsao, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/228,961

(22) Filed: Sep. 9, 2011

(65) Prior Publication Data

US 2012/0062316 A1 Mar. 15, 2012

(30) Foreign Application Priority Data

Sep. 15, 2010 (TW) .............................. 99131334 A

(51) Int. Cl.
*H03F 3/45* (2006.01)
(52) U.S. Cl. .............................. 330/69; 330/258; 330/259
(58) Field of Classification Search .................... 330/69, 330/258, 259
See application file for complete search history.

(56) References Cited

U.S. PATENT DOCUMENTS

| | | | |
|---|---|---|---|
| 5,796,301 A * | 8/1998 | Tanabe et al. | 330/9 |
| 6,946,907 B2 * | 9/2005 | Tai | 330/69 |
| 7,154,334 B2 * | 12/2006 | Dyer et al. | 330/258 |
| 7,279,976 B1 * | 10/2007 | Chiu | 330/259 |
| 2009/0115523 A1 * | 5/2009 | Akizuki et al. | 330/260 |

* cited by examiner

*Primary Examiner* — Patricia Nguyen
(74) *Attorney, Agent, or Firm* — Birch, Stewart, Kolasch & Birch, LLP

(57) ABSTRACT

A signal generating apparatus comprises an amplifier, which comprises differential input terminals for receiving a first input signal, a common mode output signal adjusting terminal for receiving a second input signal, and an output terminal. The signal generating apparatus may provide two or more differential output signals according to the first input signal, and provide two or more common mode output signals according to the second input signal. The amplifier provides an output signal comprising one of the differential output signals and one of the common mode output signals at the output terminal.

20 Claims, 4 Drawing Sheets

SIGNAL GENERATING APPARATUS AND METHOD THEREOF

CROSS-REFERENCE TO RELATED APPLICATIONS

This application claims the benefit of priority to Taiwanese Patent Application No. 099131334, filed on Sep. 15, 2010, the entirety of which is incorporated herein by reference for all purposes.

BACKGROUND

The present disclosure generally relates to signal generating apparatuses and methods, and more particularly, to the apparatuses and methods for generating output signals by combining multiple input signals.

In some signal transmission techniques, different voltage values are used to carry different information for increasing the transmission rate. For example, 0 volt, 1 volt, 2 volt, and 3 volt may be used to carry the two-bit messages of 00, 01, 10, and 11, respectively. When the voltage difference between the transmitted information decreases, however, more sophisticated hardware may be needed to transmit and receive the messages, and therefore elongate the hardware development time and increase the hardware cost.

Based on the same concept, in some applications, multiple signals are combined as a single output signal, which also uses different voltage values to carry the information from the multiple signals simultaneously. For example, in High Definition Media Interface (HDMI) applications, the HDMI Ethernet Channel (HEC) signals and the Audio Return Channel (ARC) signals may be combined as the HDMI Ethernet and Audio Return Channel (HEAC) signals for carrying the information of the HEC signals and the ARC signals simultaneously.

In some conventional approaches, the HEC signals and the ARC signals are generated by different hardware and the generated HEC signals and ARC signals are combined by another hardware. Thus, the hardware for the conventional approaches not only incurs more cost, but also consumes more energy. Besides, the integration of multiple hardware blocks also presents more challenges in the hardware design and manufacturing process.

SUMMARY

In view of the foregoing, it is appreciated that a substantial need exists for a simplified apparatus and method for generating output signals by combining multiple input signals to mitigate the problems mentioned above.

An example embodiment of a signal generating apparatus, comprising: a pair of first differential input terminals for receiving a first input signal; a common mode output signal adjusting terminal for receiving a second input signal; a first output terminal; and a first amplifying circuit, coupling with the first differential input terminals, the common mode output signal adjusting terminal, and the first output terminal, for generating two or more differential output signals according to the first input signal, and generating two or more common mode output signals according to the second input signal; wherein the first amplifying circuit generates a first output signal comprising one of the differential output signals and one of the common mode output signals at the output terminal.

An example embodiment of a signal generating method, comprising: receiving a first input signal at a common mode output signal adjusting terminal of a first amplifying circuit and receiving a second input signal at a pair of differential input terminals of the first amplifying circuit for generating a first output signal comprising a first common mode output signal and a first differential output signal at a first output terminal of the first amplifying circuit; receiving the first input signal at the common mode output signal adjusting terminal of the first amplifying circuit and receiving a third input signal at the differential input terminals of the first amplifying circuit for generating a second output signal comprising the first common mode output signal and a second differential output signal at the first output terminal of the first amplifying circuit; receiving a fourth input signal at the common mode output signal adjusting terminal of the first amplifying circuit and receiving the second input signal at the differential input terminals of the first amplifying circuit for generating a third output signal comprising a second common mode output signal and the first differential output signal at the first output terminal of the first amplifying circuit; receiving the fourth input signal at the common mode output signal adjusting terminal of the first amplifying circuit and receiving the third input signal at the differential input terminals of the first amplifying circuit for generating a fourth output signal comprising the second common mode output signal and the second differential output signal at the first output terminal of the first amplifying circuit; wherein the first common mode output signal and the second common mode output signal have different signal values and the first differential output signal and the second differential output signal have different signal values.

Another example embodiment of a signal generating apparatus, comprising: a first amplifying circuit, comprising a pair of first differential input terminals for receiving a plurality of HDMI Ethernet Channel (HEC) signals; a common mode output signal adjusting terminal; and a first output terminal for generating a plurality of output signal; and a second amplifying circuit, comprising a pair of second differential input terminals for receiving the output signal and a plurality of Audio Return Channel (ARC) signals; and a second output terminal, coupling with the common mode output signal adjusting terminal of the first amplifying circuit, for generating a signal difference between the second differential input terminals, part of the signal difference, or multiple of the signal difference.

It is understood that both the foregoing general descriptions and the following detailed descriptions are exemplary and explanatory only and are not restrictive of the invention, as claimed.

DETAILED DESCRIPTION

Reference will be made in detail to exemplary embodiments of the disclosure, which are illustrated in the accompanying drawings. The same reference numbers may be used throughout the drawings to refer to the same or like parts or operations.

Certain terms are used throughout the description and the following claims to refer to particular components. As one skilled in the art will appreciate, a component may be referred to as different names. This disclosure does not intend to distinguish between components that differ in name but not in function. In the following description and in the claims, the terms "include" and "comprise" are used in an open-ended fashion, and thus should be interpreted to mean "include, but not limited to" The phrase "coupled with" is intended to compass any indirect or direct connection. Accordingly, if this disclosure mentioned that a first device is coupled with a second device, it means that the first device may be directly or indirectly connected to the second device through an electrical connection, wireless communications, optical communications, or other signal connections with/without other intermediate device or connection means.

Figure 1:
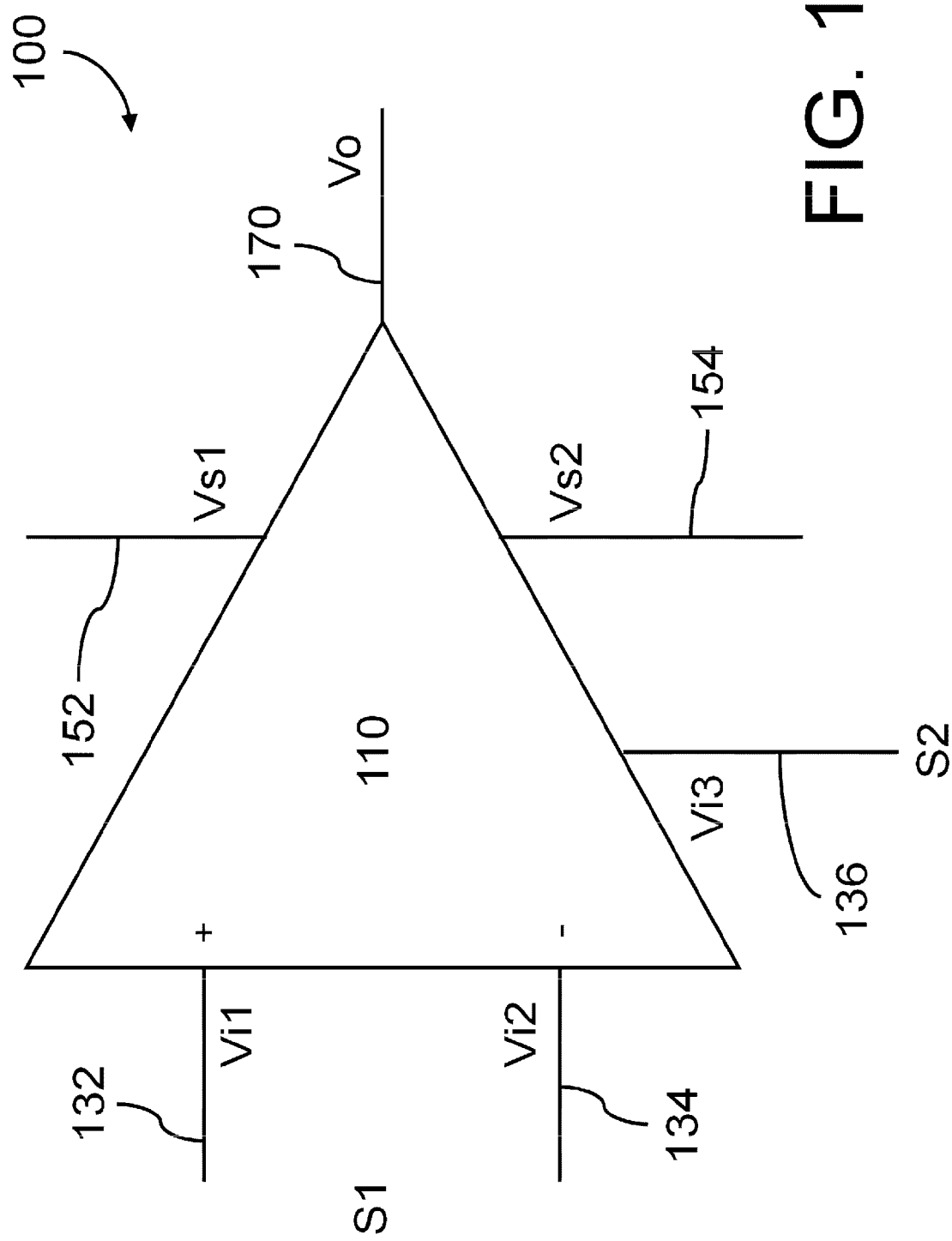
FIG. 1 shows a simplified block diagram of an example signal generating apparatus.

FIG. 1 shows a simplified block diagram of an example signal generating apparatus 100 according to one embodiment of the present invention. The signal generating apparatus 100 comprises an amplifying circuit 110, a pair of differential input terminals 132 and 134, a common mode output signal adjusting terminal 136, power supply terminals 152 and 154, and an output terminal 170. The amplifying circuit 110 may comprises one or more operational amplifier(s), transconductance amplifier(s), differential amplifier(s), or other suitable types of amplifier(s) for collaborating with other peripheral circuits (not shown in FIG. 1) through the input and output terminals.

In this embodiment, the differential input terminals 132 and 134 are coupled with the non-inverting input terminal and the inverting input terminal of the amplifying circuit 110, respectively. The common mode output signal adjusting terminal 136 and the output terminal 170 are respectively coupled with the common mode output signal adjusting terminal and the output terminal of the amplifying circuit 110. The voltages at the differential input terminals 132 and 134, the common mode output signal adjusting terminal 136, and the output terminal 170 are denoted as Vi1, Vi2, Vi3, and Vo, respectively. The differential input terminals 132 and 134 are used to receive a differential input signal S1 and the common mode output signal adjusting terminal 136 is used to receive an input signal S2.

The power supply terminals 152 and 154 are coupled with a suitable power source for configuring the amplifying circuit 110 to operate in a suitable operating mode. The voltages at the power supply terminals 152 and 154 are denoted as Vs1 and Vs2, respectively. For example, the power supply terminals 152 and 154 may be coupled with voltage sources, current sources, ground, and other power supplying circuit for receiving suitable voltage and/or current reference signals.

When the gain of the amplifying circuit 110 is denoted as G, the voltage Vo at the output terminal 170 equals to G×(Vi1−Vi2)+Vcm. The component G×(Vi1−Vi2) represents the differential output signal resulting from the differential input signal S1 and the component Vcm represents the common mode output signal resulting from the input signal S2. That is, when the voltage Vi1 equals Vi2 (S1 equals 0), the voltage Vo at the output terminal 170 equals the common mode output voltage Vcm. Generally, the common mode output voltage of the amplifying circuit is configured to a fixed value in other applications. On the contrary, in the embodiment in FIG. 1, the common mode output voltage Vcm of the amplifying circuit 110 is configured to provide multiple values by configuring the input signal S2 at the common mode output signal adjusting terminal 136. Thus, the amplifying circuit 110 may be configured to generate two or more common mode output signal values for providing the designated common mode output signal Vcm and therefore the output voltage Vo. For example, the amplifying circuit 110 may be configured to generate the common mode output signal Vcm=Vx+N×Vi3, where Vx is a predetermined voltage value and N is a suitable constant. FIG. 1 is illustrative only and people of ordinary skill in the art may understand there are other embodiments in accordance with the present invention for adjusting the input signal S2 of the common mode output signal adjusting terminal 136 and collaborating with the amplifying circuit 110 and/or other peripheral circuits to generate multiple common mode output signals.

The input signal S1 is transmitted to the differential input terminals 132 and 134 for generating the differential output signals at the output terminal 170. Besides, in some embodiments, the gain G of the amplifying circuit 110 may be configured according the signal value of the input signal S1. For example, when the signal value of the input signal S1 is comparatively small, the gain G of the amplifying circuit 110 may be configured to be larger. On the other side, when the signal value of the input signal S1 is comparatively large, the gain G of the amplifying circuit 110 may be configured to be smaller.

Because the output signal Vo at the output terminal 170 of the amplifying circuit 110 comprises the differential output signal G×(Vi1−Vi2) resulting from the input signal S1 and the common mode output signal Vcm resulting from the input signal 32, the amplifying circuit 110 may generate the output signal Vo, which comprises the combination of the input signals S1 and S2. In the specification and the following claims, the combination of the input signals S1 and S2 may comprise the combination of the input signal S1, part of the input signal S1, or multiple of the input signal S1, and the input signal S2, part of the input signal S2, or multiple of the input signal S2.

In the embodiment in FIG. 1, the amplifying circuit 110 is a voltage-input-voltage-output amplifier and comprises the differential input terminals 132 and 134, the single-ended common mode output signal adjusting terminal 136, and the single-ended output terminal 170. In other embodiments, the amplifying circuit 110 may be realized with voltage-input and/or current-input amplifiers, voltage-output and/or current-output amplifiers, and single-ended and/or differential input terminals and/or output terminal(s). Moreover, the input and output signals may be analog and/or digital signals.

Figure 2:
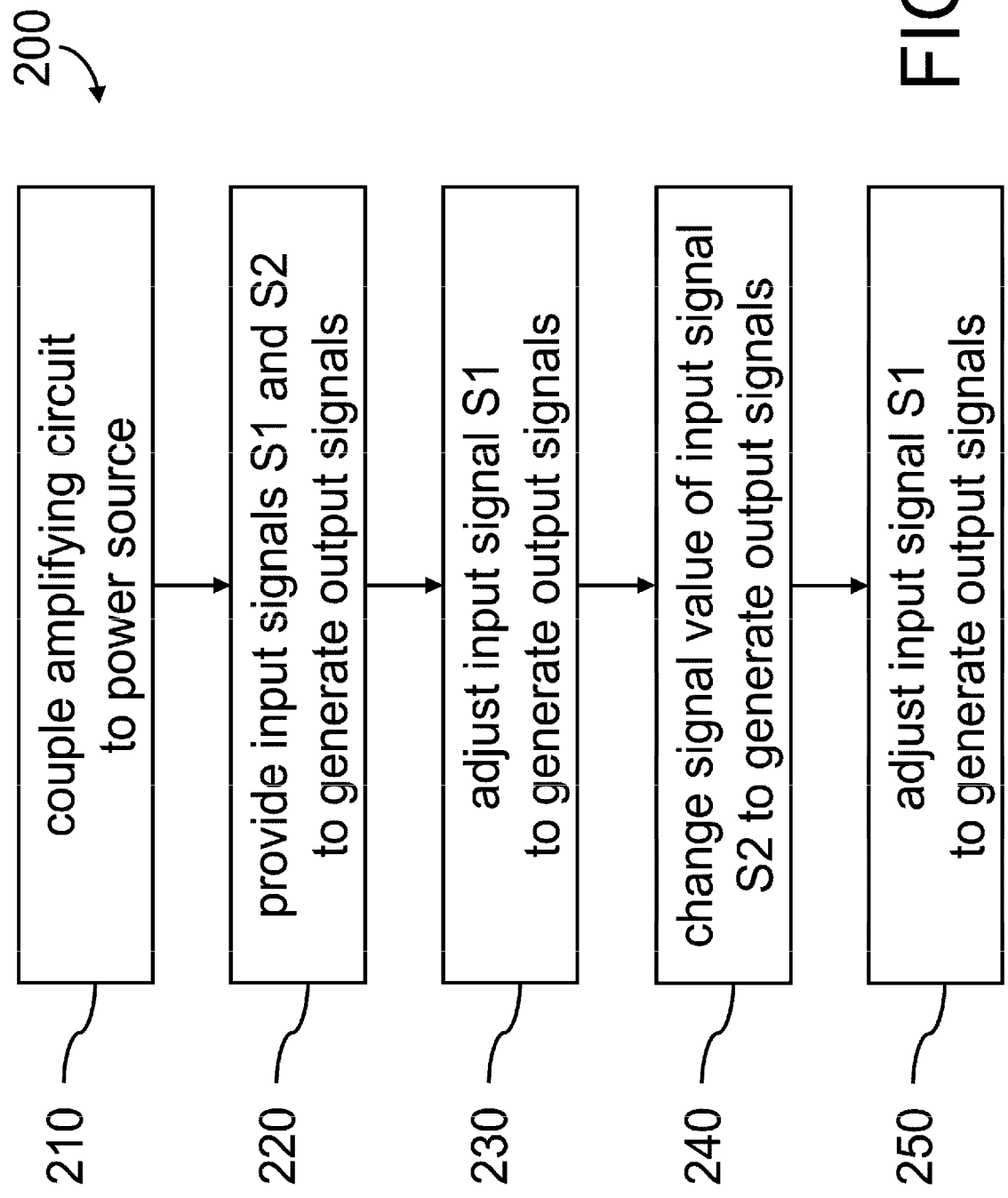
FIG. 2 shows a simplified flowchart of an example signal generating method.
Figure 3:
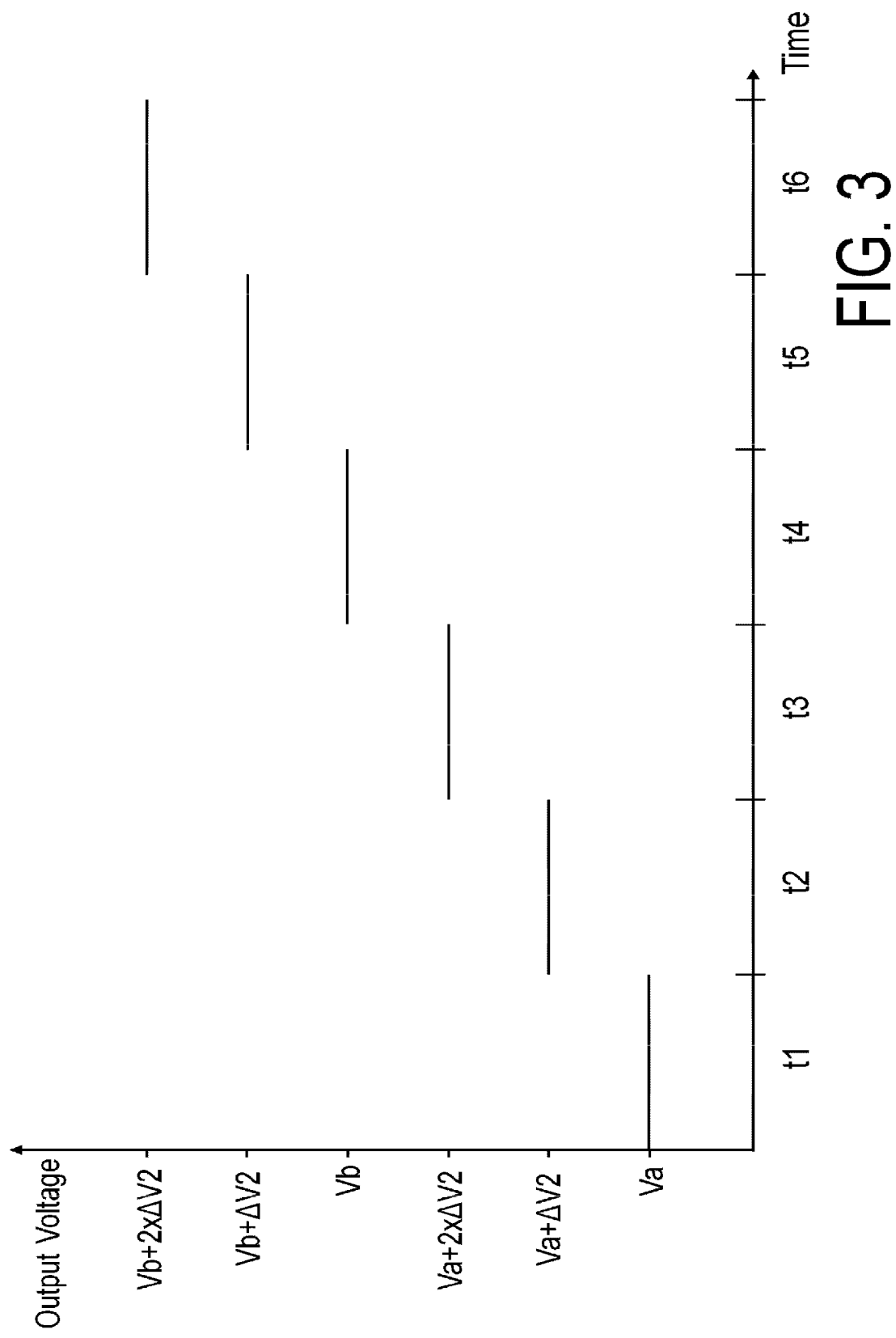
FIG. 3 shows a simplified waveform of the generated output signals with the signal generating method in FIG. 2.

The operation of the signal generating apparatus 100 will be explained in more details below with FIGS. 2 and 3. FIG. 2 shows a simplified flowchart 200 of an example signal generating method according to one embodiment of the present invention and FIG. 3 shows the generated output signal Vo with the signal generating method in FIG. 2.

In the operation 210, the power supply terminals 152 and 154 are coupled with a suitable power source for configuring the amplifying circuit in the suitable operation mode. For example, the power supply terminals 152 and 154 may be coupled with a 5V voltage source and the ground, respective.

In the operation 220, the input signal S2 of a first signal value is provided at the common mode output signal adjusting terminal 136. The input signal S1 is provided at the differential input terminals 132 and 134. At this moment, the input signal S1 is configured to be a second signal value, e.g., 0 in this embodiment. For example, as shown in the duration t1 in FIG. 3, the output signal Vo at the output terminal 170 of the amplifying circuit 110 equals Va.

In the operation 230, the input signal S2 is fixed at the first signal value and the input signal S1 is adjusted to generate different signal values of the output signal Vo. For example, in the duration t2 in FIG. 3, when the input signal S1 is configured to be $\Delta V1$, the output signal Vo at the output terminal 170 of the amplifying circuit 110 equals $Va+\Delta V2$. In the duration t3 in FIG. 3, when the input signal S1 is configured to be $2\times\Delta V1$, the output signal Vo at the output terminal 170 of the amplifying circuit 110 equals $Va+2\times\Delta V2$. $\Delta V1$ and $\Delta V2$ may be configured to have the same value or different values and the gain of the amplifying circuit 110 may be configured to be the same or different for different input signals S1 and/or S2.

In the operation 240, the input signal S2 is configured to be a third signal value and the input signal S1 is configured to the second signal value, i.e., 0 in this embodiment. For example, as shown in the duration t4 in FIG. 3, the output signal Vo the output terminal 170 of the amplifying circuit 110 equals Vb.

In the operation 250, the input signal S2 is fixed at the third signal value and the input signal S1 is adjusted to generate different signal values of the output signal Vo. For example, in the duration t5 in FIG. 3, when the input signal S1 is configured to be $\Delta V1$, the output signal Vo at the output terminal 170 of the amplifying circuit 110 equals $Vb+\Delta V2$. In the duration t6 in FIG. 3, when the input signal S1 is configured to be $2\times\Delta V1$, the output signal Vo at the output terminal 170 of the amplifying circuit 110 equals $Vb+2\times\Delta V2$.

In other embodiments, the input signal S1 may be configured to be different values in operations 230 and 250. For example, the input signal S1 in the operation 250 may be configured to be $\Delta V3$ and make the output signal Vo at the output terminal 170 of the amplifying circuit 110 to be $Vb+\Delta V4$.

In the embodiment in FIGS. 2 and 3, the amplifying circuit 110 combines the input signal S1 comprising three possible signal values and the input signal S2 comprising two possible signal values to generate the output signal Vo at the output terminal 170, which comprises the combination of the input signals S1 and S2. In other embodiments, the input signals S1 and S2 may be realized by different bits of a signal. For example, a signal T comprises three bits T0, T1, and T2 and therefore eight signal values are needed to represent the eight possible combination of the three bits. In accordance with the signal generating method in FIG. 2, the bit T0 may be used as the input signal S2 and the bits T1 and T2 may be used as the input signal S1 to generate the eight signal values at the output terminal 170 of the amplifying circuit 110.

In the embodiment above, the input signals S1 and S2 and the output signal Vo are shown as discrete voltage signals in FIG. 3. In other embodiments, the input signals S1 and S2 and the output signal Vo may be realized with discrete and/or continuous voltage signals and/or current signals. Moreover, the input signals S1 and S2 and the output signal Vo may have positive or negative values. For example, the input signals S1 and S2 may be realized with the continuous sine wave, the triangle wave, and/or the rectangular wave.

The variations and alternative embodiments of the signal generating apparatus and the signal generating method are obvious to those skilled in the art. For example, in another embodiment, instead of generating six different signal values in FIG. 3, the input signals S1 and S2, comprising three and two possible signal values respectively, may generate five different signal values by configuring $Va+2\times\Delta V2=Vb$.

In still another embodiment, the amplifying circuit 110 may combine the input signals S1 and S2, each comprising two or more different signal values, and generate the output signal Vo comprising the combination of the input signals S1 and S2.

In yet another embodiment, the input signal S1 is fixed and the input signal S2 is adjusted to generate different signal values of the output signal Vo. In yet still another embodiment, the input signals S1 and S2 may be adjusted concurrently to generate different signal values of the output signal Vo.

The signal generating apparatus 100 and the signal generating method of the present invention may also be incorporated in the signal encoding/decoding processes. For example, in the HDMI application, the Multi-level transmit-3 (MLT-3) encoded HEC signals may be used as the input signal S1 and the ARC signal may be used as the input signal S2. The amplifying circuit 110 combines the input signals S1 (HEC signals) and S2 (ARC signals) to generate HEAC signals or differential HEAC+ and HEAC− signals at the output terminal 170.

The signal generating apparatus 100 of the present invention may be easily collaborated with other peripheral circuits. For example, in the HDMI application, when the HEC signals and the ARC signals may not be used as the input signal S1 and S2 directly, some peripheral circuits are needed to convert the HEC signals and/or ARC signals to the moderate voltage level or current level and transmit the converted signals to the amplifying circuit 110.

Figure 4:
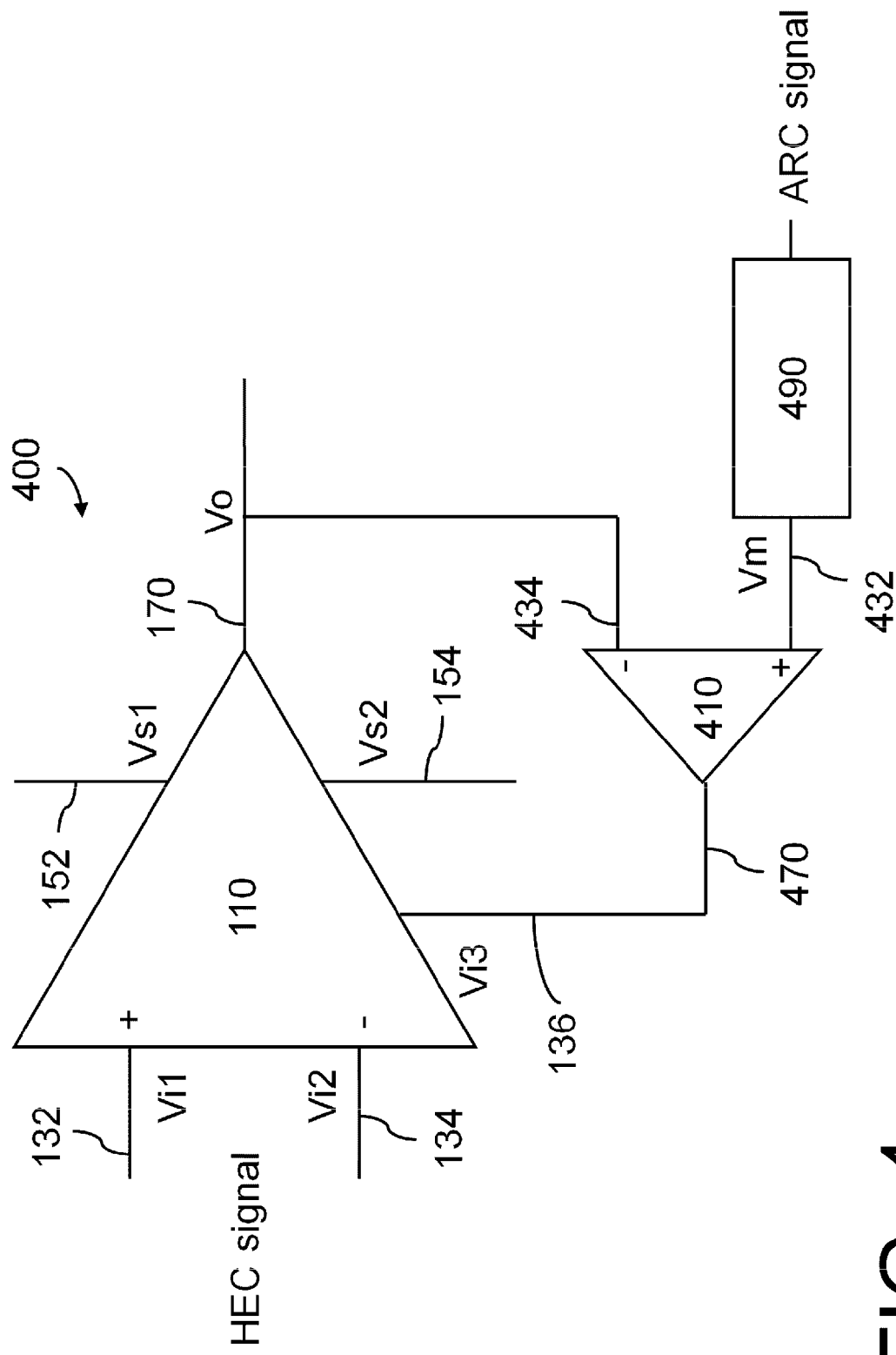
FIG. 4 shows a simplified block diagram of another example signal generating apparatus, all arranged in accordance with at least some embodiments of the present disclosure described herein.

FIG. 4 shows a simplified block diagram of another example signal generating apparatus 400 according to the present invention. In addition to the amplifying circuit 110 in FIG. 1, the signal generating apparatus 400 further comprising an amplifying circuit 410 and a signal processing circuit 490. The non-inverting differential input terminal 432 of the amplifying circuit 410 is coupled with the signal processing circuit 490. The inverting differential input terminal 434 of the amplifying circuit 410 is coupled with the output terminal 170 of the amplifying circuit 110. The output terminal 470 of the amplifying circuit 410 is coupled with the common mode output signal adjusting terminal 136. The power supply terminals of the amplifying circuit 410 are not shown in FIG. 4 for conciseness.

In the embodiment in FIG. 4, the signal processing circuit 490 receives the ARC signals, converts the ARC signals to a moderate voltage level, and transmits the converted signals Vm to the inverting differential input terminal 434 of the amplifying circuit 410. For example, the signal processing circuit 490 may be realized with the voltage dividing circuit. The voltage dividing circuit may be realized with passive and/or active circuit elements for converting ARC signals to a moderate voltage level.

In this embodiment, when the output signal Vo at the output terminal 170 of the amplifying circuit 110 is larger than the converted signals Vm of the signal processing circuit 490, the output signal at the output terminal 470 of the amplifying circuit 410 decreases. Accordingly, the voltage Vi3 at the common mode output signal adjusting terminal 136 and the output signal Vo at the output terminal 170 of the amplifying circuit 110 decrease. When the output signal Vo at the output terminal 170 of the amplifying circuit 110 is smaller than the converted signals Vm of the signal processing circuit 490, the output signal at the output terminal 470 of the amplifying circuit 410 increases. Accordingly, the voltage Vi3 at the common mode output signal adjusting terminal 136 and the output signal Vo at the output terminal 170 of the amplifying circuit 110 increase. Therefore, the amplifying circuits 110 and 410 may cooperatively use the ARC signals to generate the desired common mode output signal Vcm at the output terminal 170 of the amplifying circuit 110.

In another embodiment, the non-inverting differential input terminal 432 of the amplifying circuit 410 is coupled with the output terminal 170 of the amplifying circuit 110. The inverting differential input terminal 434 of the amplifying circuit 410 may is coupled with the signal processing circuit 490. The output terminal 470 of the amplifying circuit 410 is coupled with the common mode output signal adjusting terminal 136. By properly configuring the gain of the amplifying circuit 470, e.g., configuring the gain of the amplifying circuit 470 as a negative value, the amplifying circuits 110 and 410 may still cooperatively use the ARC signals to generate the desired common mode output signals Vcm at the output terminal 170 of the amplifying circuit 110 in similar manner.

In other embodiments, if necessary, the HEC signals may also be converted to a moderate signal level with other signal processing circuit so that the amplifying circuit 110 may generate the desired different output signals.

Other embodiments of the invention will be apparent to those skilled in the art from consideration of the specification and practice of the invention disclosed herein. It is intended that the specification and embodiments be considered as exemplary only, with a true scope and spirit of the invention being indicated by the following claims.

What is claimed is:

1. A signal generating apparatus, comprising:
    a pair of first differential input terminals for receiving a first input signal;
    a common mode output signal adjusting terminal for receiving a second input signal;
    a first output terminal; and
    a first amplifying circuit, coupling with the first differential input terminals, the common mode output signal adjusting terminal, and the first output terminal, for generating two or more differential output signals according to the first input signal, and generating two or more common mode output signals according to the second input signal;
    wherein the first amplifying circuit generates a first output signal comprising one of the differential output signals and one of the common mode output signals at the output terminal.

2. The signal generating circuit of claim 1, further comprising:
    a second amplifying circuit, comprising:
    a non-inverting differential input terminal for coupling with the first output terminal;
    an inverting differential input terminal for receiving the second input signal; and
    a second output terminal, coupling with the common mode output signal adjusting terminal of the first amplifying circuit,
    wherein the second amplifying circuit generates a second output signal at the second output terminal according to the second input signal and the first output signal.

3. The signal generating circuit of claim 2, wherein the inverting differential input terminal of the second amplifying circuit receives the second input signal through a voltage dividing circuit.

4. The signal generating circuit of claim 2, wherein the first input signal, the second input signal, the first output signal, the second output signal, the differential output signals, the common mode output signals are represented in the voltage form and/or in the current form.

5. The signal generating circuit of claim 1, further comprising:
    a second amplifying circuit, comprising:
    a non-inverting differential input terminal for receiving the second input signal;
    an inverting differential input terminal for coupling with the first output terminal; and
    a second output terminal, coupling with the common mode output signal adjusting terminal of the first amplifying circuit,
    wherein the second amplifying circuit generates a second output signal at the second output terminal according to the second input signal and the first output signal.

6. The signal generating circuit of claim 5, wherein the non-inverting differential input terminal of the second amplifying circuit receives the second input signal through a voltage dividing circuit.

7. The signal generating circuit of claim 5, wherein the first input signal, the second input signal, the first output signal, the second output signal, the differential output signals, the common mode output signals are represented in the voltage form and/or in the current form.

8. The signal generating circuit of claim 1, wherein the first input signal, the second input signal, the first output signal, the second output signal, the differential output signals, the common mode output signals are represented in the voltage form and/or in the current form.

9. The signal generating circuit of claim 1, wherein the first amplifying circuit comprises a differential amplifier, an operational amplifier, and/or a transconductance amplifier.

10. A signal generating method, comprising:
    receiving a first input signal at a common mode output signal adjusting terminal of a first amplifying circuit and receiving a second input signal at a pair of differential input terminals of the first amplifying circuit for generating a first output signal comprising a first common mode output signal and a first differential output signal at a first output terminal of the first amplifying circuit;
    receiving the first input signal at the common mode output signal adjusting terminal of the first amplifying circuit and receiving a third input signal at the differential input terminals of the first amplifying circuit for generating a second output signal comprising the first common mode output signal and a second differential output signal at the first output terminal of the first amplifying circuit;
    receiving a fourth input signal at the common mode output signal adjusting terminal of the first amplifying circuit and receiving the second input signal at the differential input terminals of the first amplifying circuit for generating a third output signal comprising a second common mode output signal and the first differential output signal at the first output terminal of the first amplifying circuit;
    receiving the fourth input signal at the common mode output signal adjusting terminal of the first amplifying circuit and receiving the third input signal at the differential input terminals of the first amplifying circuit for generating a fourth output signal comprising the second common mode output signal and the second differential output signal at the first output terminal of the first amplifying circuit;
    wherein the first common mode output signal and the second common mode output signal have different signal values and the first differential output signal and the second differential output signal have different signal values.

11. The signal generating method of claim 10, further comprising:
    receiving the first input signal and the fourth input signal at the common mode output signal adjusting terminal of the first amplifying circuit through a second amplifying circuit;

wherein the second amplifying circuit comprises
a non-inverting differential input terminal coupling with the first output terminal,
an inverting differential input terminal for receiving the first input signal and the fourth input signal, and
a second output terminal, coupling with the common mode output signal adjusting terminal of the first amplifying circuit.

12. The signal generating method of claim 11, wherein the inverting differential input terminal of the second amplifying circuit receives the first input signal and the fourth input signal through a voltage dividing circuit.

13. The signal generating method of claim 11, wherein the first, the second, the third, and the fourth input signals, the first and the second common mode output signals, and the first and the second differential output signals are represented in the voltage form and/or in the current form.

14. The signal generating method of claim 10, further comprising:
receiving the first input signal and the fourth input signal at the common mode output signal adjusting terminal of the first amplifying circuit through a second amplifying circuit;
wherein the second amplifying circuit comprises
a non-inverting differential input terminal for receiving the first input signal and the fourth input signal,
an inverting differential input terminal for coupling with the first output terminal, and
a second output terminal, coupling with the common mode output signal adjusting terminal of the first amplifying circuit.

15. The signal generating method of claim 14, wherein the non-inverting differential input terminal of the second amplifying circuit receives the first input signal and the fourth input signal through a voltage dividing circuit.

16. The signal generating method of claim 14, wherein the first, the second, the third, and the fourth input signals, the first and the second common mode output signals, and the first and the second differential output signals are represented in the voltage form and/or in the current form.

17. A signal generating apparatus, comprising:
a first amplifying circuit, comprising:
a pair of first differential input terminals for receiving a plurality of HDMI Ethernet Channel (HEC) signals;
a common mode output signal adjusting terminal; and
a first output terminal for generating a plurality of output signal; and
a second amplifying circuit, comprising:
a pair of second differential input terminals for receiving the output signal and a plurality of Audio Return Channel (ARC) signals; and
a second output terminal, coupling with the common mode output signal adjusting terminal of the first amplifying circuit, for generating a signal difference between the second differential input terminals, part of the signal difference, or multiple of the signal difference;
wherein one of the output signals comprises the combination of one of the HEC signals and one of the ARC signals.

18. The signal generating apparatus of claim 17, wherein the non-inverting differential input terminal receives the output signals and the inverting differential input terminal receives the ARC signals.

19. The signal generating apparatus of claim 17, wherein the non-inverting differential input terminal receives the ARC signals and the inverting differential input terminal receives the output signals.

20. The signal generating apparatus of claim 17, wherein the second amplifying circuit receives the ARC signals through a voltage dividing circuit.

* * * * *